(12) United States Patent
Tann

(10) Patent No.: US 6,215,432 B1
(45) Date of Patent: Apr. 10, 2001

(54) REDUCING DIGITAL SWITCHING NOISE IN MIXED SIGNAL IC'S

(75) Inventor: Christopher P. A. Tann, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/262,717

(22) Filed: Mar. 4, 1999

(51) Int. Cl.[7] .................................................. H03M 1/12
(52) U.S. Cl. ................................................. 341/155; 341/144
(58) Field of Search .................... 341/144, 155, 341/110, 122

(56) References Cited

U.S. PATENT DOCUMENTS

| 4,746,899 | 5/1988 | Swanson et al. | 340/347 |
|---|---|---|---|
| 5,010,347 | 4/1991 | Yukawa | 341/143 |
| 5,373,293 | 12/1994 | Hirata | 341/118 |
| 5,604,500 | 2/1997 | Murakami | 341/118 |
| 5,648,778 | 7/1997 | Linz et al. | 341/110 |
| 5,757,302 | * 5/1998 | Hino | 341/155 |
| 5,914,681 | * 6/1999 | Rundel | 341/135 |

FOREIGN PATENT DOCUMENTS 2195848A 4/1998 (GB).

OTHER PUBLICATIONS

Blalack, T. et al., "TP 11.8: The Effects of Switching Noise on an Oversampling A/D Converter," 1995 IEEE International Solid–State Circuits Conference, U.S., IEEE Inc., New York, vol. 38, pp. 200–201, 367 (Feb. 1, 1995).

* cited by examiner

*Primary Examiner*—Peguy JeanPierre
(74) *Attorney, Agent, or Firm*—Thomas Schneck; John P. McGuire, Jr.

(57) ABSTRACT

A mixed signal IC comprising analog circuitry for converting between analog and digital signals and digital circuitry includes circuitry to produce a conversion enable signal which causes the analog circuit to perform a conversion between an analog signal and a digital signal. The circuitry also asserts a warning signal prior to production of the enable signal to momentarily disable the digital circuitry during operation of the analog circuitry. By so doing, noise artifacts from operation of the digital circuitry is eliminated when the analog circuitry is making a conversion.

23 Claims, 3 Drawing Sheets

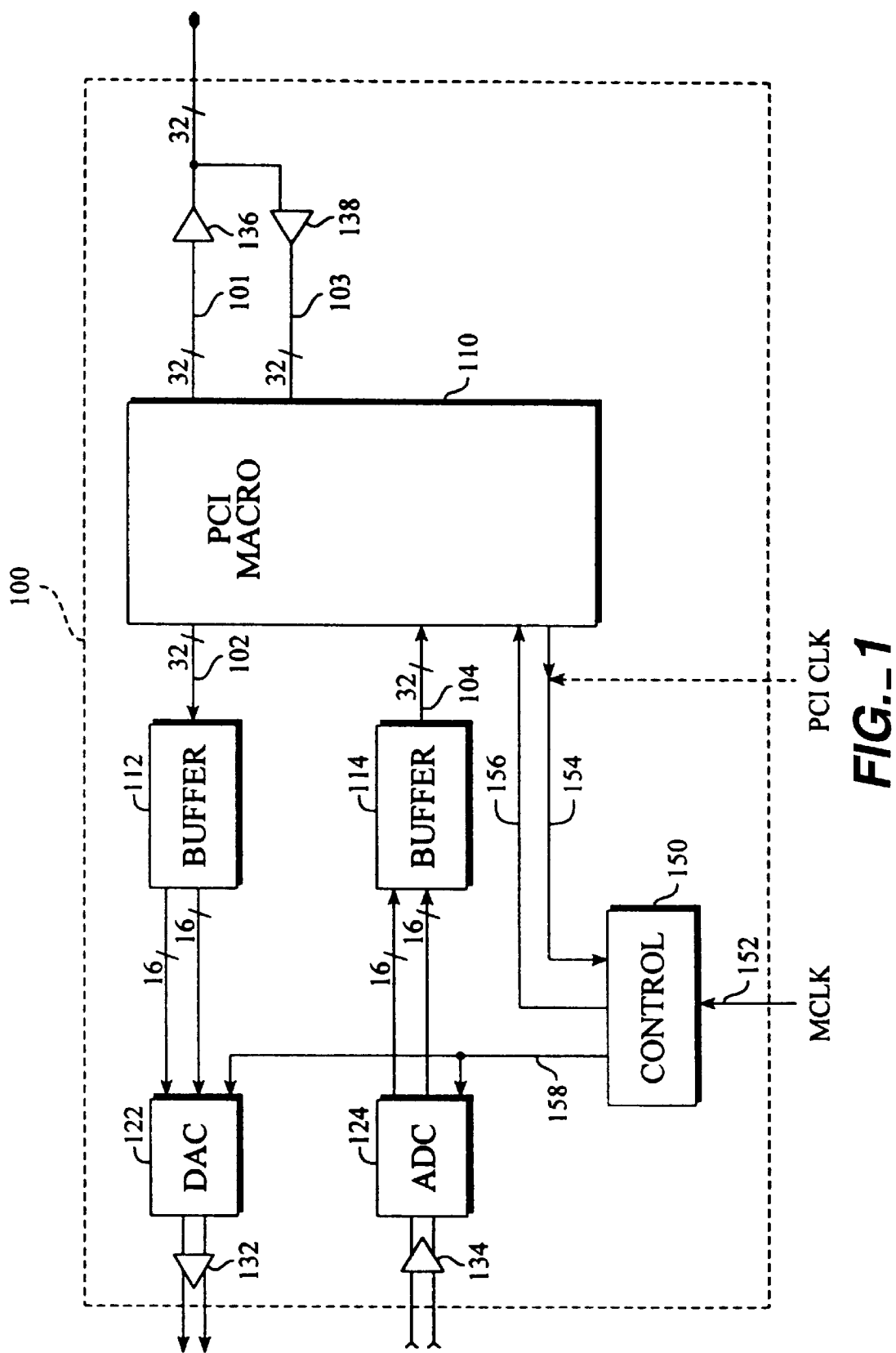
FIG._1

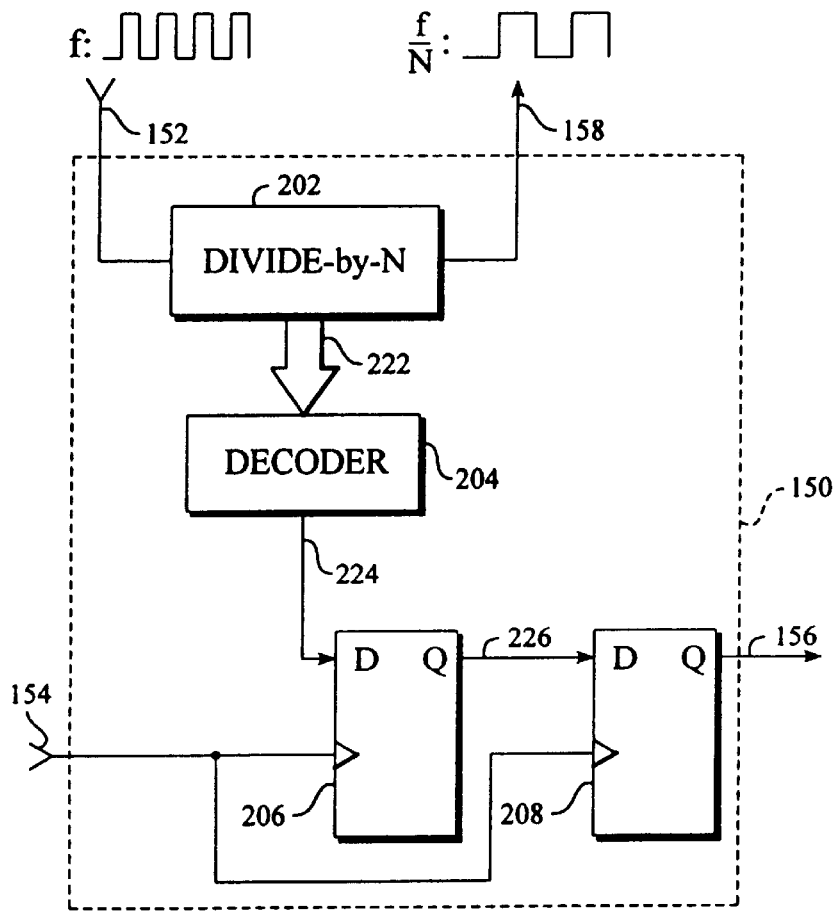
FIG._2
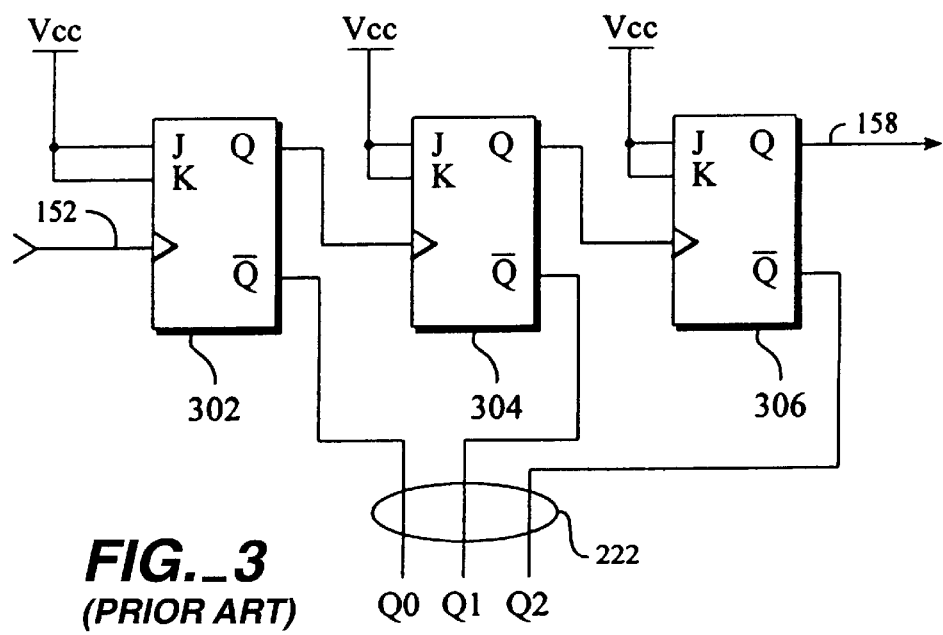
FIG._3
(PRIOR ART)

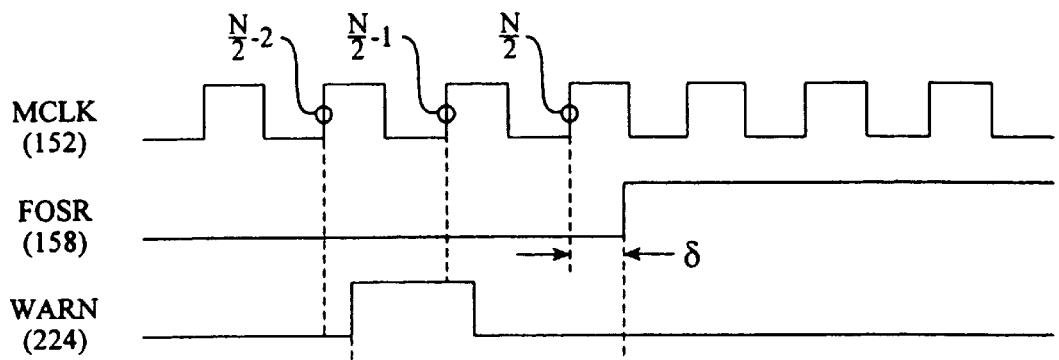
FIG._4A
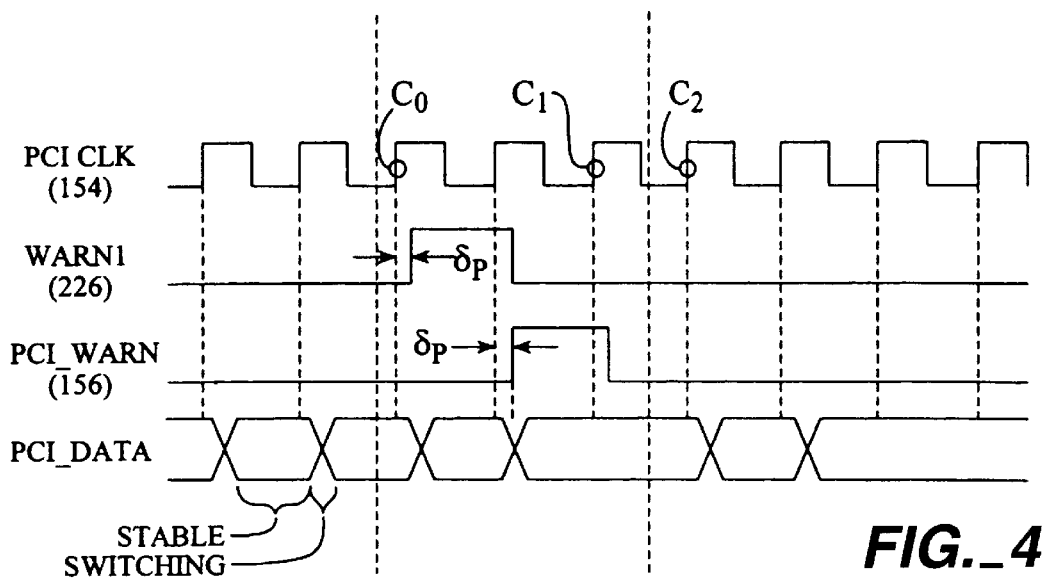
FIG._4B
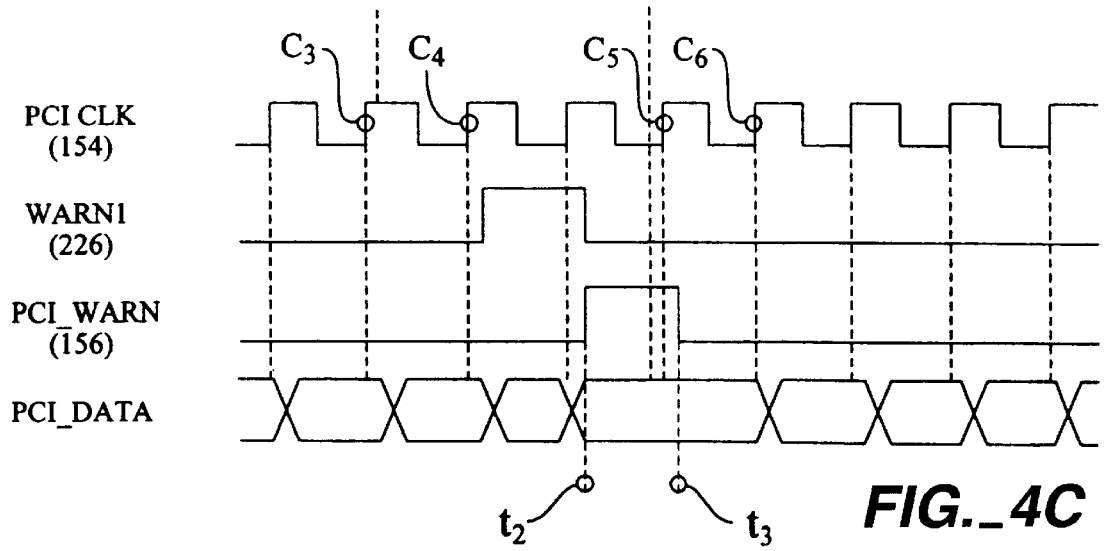
FIG._4C

REDUCING DIGITAL SWITCHING NOISE IN MIXED SIGNAL IC'S

TECHNICAL FIELD OF THE INVENTION

The present invention relates generally to integrated circuits comprising a digital logic and sampled analog circuits, and more specifically to a method and apparatus for reducing digital switching noise in such circuits.

BACKGROUND ART

With the advances in integrated circuit technology, it is becoming practical to include increasingly more functionality into single integrated circuit devices. This includes a trend to combine high-precision analog circuitry on the same die as high performance digital circuitry. However, due to the nature of IC design, high-precision analog circuitry can be adversely affected by the noise generated when switching the digital logic. For example, separate power supplies are typically employed to power the digital circuitry and the analog circuits. Noise associated with ground plane coupling between the power supplies will interfere with proper operation of the analog circuitry.

The majority of high-precision analog converters used in such applications are of a kind known as sampled converters. These converters are "sampled" in the sense that their inputs (or outputs) are present only at discrete points in time. This is compared too continuous analog systems in which the input (or output) is continuously available. The presence of digital noise in a sampled analog system can reduce its dynamic range by many dB, thus degrading performance to such an extent that its application in a mixed-signal device may not by viable.

Digital switching noise can be generated from many sources. One major source of noise is due to digital bus output switching, where many outputs of the device switch at the same time. Due to the currents and loads involved in output pads, this generates a relatively large amount of noise compared to purely internal digital circuitry. However, with large synchronous systems where many internal nodes are switching simultaneously, internal noise may also be a problem.

Consider a codec with a peripheral component interchange (PCI) interface, for example. A large part of the digital noise in such a chip will occur due to switching of the PCI outputs during a read transaction (i.e. data output operation). These outputs will toggle after a rising edge of a PCI clocking signal (with a maximum delay of 11 nS). If the toggling of the PCI outputs coincides with an analog sample (for example), the conversion may suffer noise artifacts from the PCI switching. As the sample clock and the PCI clock are completely asynchronous, it is very likely that this will occur during device operation.

What is needed is a method and apparatus for operating mixed-signal devices in such a way that eliminates (or at least keeps to a minimum) the adverse effects of digital noise during sampling by the analog circuitry.

SUMMARY OF THE INVENTION

In a mixed signal IC, conversion between analog and digital signals comprises producing a sample-enable signal based on a system clock. A warning signal, also based on the system clock, is asserted prior to the sample-enable signal. The warning signal is then synchronized with respect to a second clock, which serves as a clocking signal for the digital circuitry portion of the mixed signal IC. The warning signal is coupled to the digital circuitry and serves to momentarily disable the digital circuitry, thus enabling the analog circuitry to operate in the absence of digitally produced noise. When the warning signal is de-asserted, operation of the digital circuitry resumes. In one embodiment of the invention, the digital circuitry is a PCI bus interface circuit.

BRIEF DESCRIPTION OF THE DRAWINGS

FIG. 1 is a block level diagram of a mixed signal device in accordance with the present invention.

FIG. 2 shows a block diagram of the control circuit shown in FIG. 1.

FIG. 3 is a typical divider circuit.

FIGS. 4A–4C are timing diagrams showing the operation of the invention.

BEST MODE FOR CARRYING OUT THE INVENTION

FIG. 1 shows a mixed signal integrated circuit (100) according to a preferred embodiment of the present invention. In a mixed signal IC, the digital circuitry and the analog circuitry share the same substrate, typically an N-type material, into which active devices comprising the logic are formed.

The analog circuitry comprises a codec, consisting of a digital-to-analog converter circuit (DAC) 122 and an analog-to-digital converter circuit (ADC) 124. Preferably, the Sigma-Delta technique is used in the embodiment shown in FIG. 1. However, any sampled A/D or D/A converter can be used with the technique of the present invention.

An activation signal FOSR 158, derived from a control circuit 150, feeds into each of DAC 122 and ADC 124. FOSR serves as a sample-enable signal, enabling each of the conversion circuits to sample an analog signal for conversion to a digital datum or to generate an analog signal by conversion from a digital datum. In accordance with the preferred embodiment, the conversion is initiated on a rising edge of the FOSR signal and typically completes in less than a nanosecond. It is noted however, that conversion could also be initiated on a falling edge of FOSR without departing from the invention.

Associated with each of conversion circuits 122 and 124 is a buffer 112 and 114 for holding data, either to be converted to analog form or to store the result of an analog to digital conversion. Buffers 112 and 114 (e.g. FIFOs) feed into a digital circuit, which in the disclosed embodiment is a bus interface. The interface used in the preferred embodiment is the peripheral component interchange (PCI) interface, selected for its popularity in the PC industry. It is noted that other bus interfaces, such as ISA, are readily adaptable for use in accordance with the present invention, requiring only the ordinary skill of a person in the relevant technical arts.

A PCI macro 110 contains the logic which implements the PCI interface. Macro 110 includes a 32-bit input 101 and a 32-bit output 103. Drivers 136 and 138 provide an electrical interface to macro 110 from circuitry that is external to mixed signal IC 100. Macro 110 includes a 32-bit connection to buffer 112 to deliver digital data to DAC 122 for conversion to an analog signal. Conversely, a 32-bit connection 104 between buffer 114 and macro 110 provides a data path for data which represents a converted analog signal sampled by ADC 124.

Macro 110 includes an internally generated PCI clock signal (PCI_CLK) to drive the logic comprising the circuit.

In accordance with the present invention, the PCI clock signal is coupled to clock input 154 of control circuit 150. Alternatively, the PCI clock signal can be provided by an off-chip clock source. In this alternate configuration, the externally supplied PCI clock signal is coupled to clock input 154 via the path shown in dashed lines.

Macro 110 further includes an input coupled to receive a PCI_WARN signal provided on a control line 156 produced by control circuit 150. When the PCI_WARN signal is asserted, the logic comprising PCI macro 110 responds by forcing a PCI DISCONNECT or RETRY. Typically, the interfaces of commercially available PCI cores include an input signal which inhibits bus switching. For example, the preferred embodiment of the invention employs a PCI interface core designed by Phoenix Technologies Ltd. known as the PCI3232 SNF interface macro. The macro interface defines a signal TAR_FORCE_RETRY_PCI which forces a RETRY on the PCI bus. The PCI_WARN signal 156 is coupled to signal line TAR_FORCE_RETRY_PCI and by so doing effectively prevents toggling of the output drivers for one PCI bus cycle for the duration that PCI_WARN is asserted. Of course, the invention is not restricted to any one design of PCI cores. The present invention can be practiced with any of a number of alternate PCI cores.

With reference to FIGS. 1 and 2, control circuit 150 comprises a divide-by-N circuit 202 (also referred to as a frequency or clock divider) having an input 152 to which an external clock signal MCLK is connected. As can be seen, sample-enable signal 158 (FOSR) is produced by dividing down external clock signal MCLK by divider circuit 202. It is worth noting that clock signal MCLK can be the system clock, so that DAC and ADC activity is synchronized with the system clock. Alternatively, MCLK can be a clock signal separate from the system clock. The particular source of the clock signal is unimportant to practicing the present invention.

Continuing, the divider circuit 202 includes a second output 222 indicative of the counter value of the divider. Referring for a moment to FIG. 3, a typical implementation of divider circuit 202 consists of a series connection of J–K flip flops 302–306. Frequency divider circuits are fundamental in the digital arts and many variations are known. As can be seen, a divider circuit is essentially a counter, and by tapping the outputs of flip flops 302–306 the counter value can be obtained. Returning to FIG. 2, such a counter value 222 from divider 202 feeds into a selector input of decoder 204. As will be explained below with respect to the timing charts, decoder 204 is programmed to output a '1' for a predetermined value of the counter output 222. The output 224 of decoder 204 srves as the source of a WARN pulse.

WARN pulse 224 feeds into a delay circuit comprising two series-coupled flip flops 206 and 208. The flip flops are clocked by the clock signal 154 from PCI macro 110. This has the effect of delaying the WARN pulse, thus producing a signal at control line 156 that is synchronized with the PCI clock signal, namely the PCI_WARN signal. The reason for this synchronization will be explained below in connection with the timing charts.

Referring now to FIG. 2 and to the timing chart shown in FIG. 4A, signal FOSR is asserted at every N/2 cycles (counts) of external clock MCLK, the result of divide-by-N circuit 202. The shift of δ represents the effect of a propagation delay on the FOSR signal and is shown exaggerated for illustrative purposes. In principle, PCI bus switching can be inhibited by asserting a disabling signal at control line 156 (FIG. 1) at the same time that FOSR is asserted. However, since MCLK operates asynchronously with respect to PCI_CLK such a disabling signal will occur asynchronously with respect to the switching which goes on in the PCI interface. Consequently, it is possible that the disabling signal will come along at the same time or very close to a rising edge of PCI_CLK. When data input changes too close to a rising edge, the flip-flops comprising the logic can go into a metastable state and begin to oscillate. If this is not controlled, the oscillations can pass on to the other circuitry and cause functional failure. Decoder 204 and the delay circuit comprising flip-flops 206 and 208 serve to provide a synchronized disabling signal which avoids the rising edges of PCI_CLK.

Continuing, decoder 204 is programmed to produce WARN pulse 224 as shown. This can be accomplished by outputting a logic HI at every (N/2–2) counts of MCLK for a duration of one count, and a logic LO at all other times. As an alternative to using a standard decoder circuit, an equivalent custom logic circuit can be constructed with the following Verilog code fragment:

```
wire COUNTDONE = ( COUNT == 5'h00 );
assign #2 HALF = DIV >> 1;
// create a counter that counts from DIV to 0 on MCLK
always @ ( posedge MCLK or negedge RESET_B )
    begin
        if ( !RESET_B )
            COUNT <= #2 5'h0;
        else
            begin
                if ( COUNTDONE )
                    COUNT <= #2 ( DIV - 1 );
                else
                    COUNT <= ( COUNT - 1 );
            end
    end
always @ ( posedge MCLK or negedge RESET_B )
    begin
        if ( !RESET_B )
            begin
                FOSR <= #2 1'b0;
                WARN <= #2 1'b0;
            end
        else
            begin
                if ( COUNT == HALF )
                    FOSR <= #2 1'b1;
                else if ( COUNT == ( HALF - 2 ) )
                    WARN <= #2 1'b1;
                else if ( COUNT == ( HALF - 1 ) )
                    WARN <= #2 1'b0;
                else if ( COUNTDONE )
                    FOSR <= #21'b0;
            end
    end
```

As noted above, since the MCLK clock signal is generated independently of the PCI_CLK clock signal, the WARN pulse will be asynchronous relative to PCI_CLK. Referring to FIG. 4B, WARN pulse 224 is latched into flip-flop 206 on a rising edge of PCI_CLK $C_0$ to produce a signal 226 (WARN1) which in effect serves to synchronize pulse 224 to PCI_CLK. Flip-flop 208 then clocks out WARN1 at the next rising edge of PCI_CLK to produce PCI_WARN signal 156 which is coupled into PCI macro 110 (FIG. 1).

As discussed above, switching of PCI data occurs on the rising edge of PCI_CLK, with a maximum possible delay $\delta_p$ of 11 nS. For example, in FIGS. 4B and 4C PCI switching occurs at clock edges $C_0$, $C_2$ and $C_3$. It is during these times that the electrical conditions on the data bus are at their worst for the purpose of making a conversion between analog and digital data.

Returning to FIG. 4B, it can be seen that PCI_WARN is HI at clock $C_1$. Consequently, the PCI interface is prevented from switching its I/O. Thus, an electrically stable condition on the data bus is maintained, during which time the FOSR signal is asserted. This enables DAC 122 and/or ADC 124 to make a conversion between an analog signal and a digital signal, without the adverse effects of PCI switching. PCI switching then resumes at the next rising edge $C_2$ of PCI_CLK.

Refer now to FIGS. 4A and 4C for a slightly different timing situation. Here, WARN signal 224 occurs just after a rising edge $C_3$ of PCI_CLK and so is not latched by flip-flop 206. However, it is latched on the next clock edge $C_4$ to produce WARN1. At clock $C_5$ when PCI_WARN is HI, I/O switching in the PCI interface logic is disabled. This allows analog-digital conversion to occur when the FOSR signal is asserted. PCI switching does not resume until clock edge $C_6$ when PCI_WARN is de-asserted. This timing situation illustrates that WARN signal 224 must be generated two clock periods before the FOSR clock edge, to allow time for PCI_WARN to be synchronized to the PCI clock.

What is claimed is:

1. In an integrated circuit having digital logic circuitry and conversion circuitry for converting between analog and digital signals, operation of the digital logic circuitry being timed on a first clock signal, operation of the conversion circuitry being timed on a second clock signal, a method of converting between analog and digital signals, comprising:

producing a third clock signal based on the second clock signal;

asserting a warning signal based on the third clock signal;

in response to assertion of the warning signal, disabling switching of the digital logic for a period of time; and during the period of time for which switching of the digital logic circuitry is disabled, converting between an analog signal and a digital signal.

2. The method of claim 1 wherein the step of converting is synchronous with the third clock signal.

3. The method of claim 2 wherein the warning signal precedes the third clock signal.

4. The method of claim 1 further including synchronizing the warning signal with the first clock to produce a second warning signal and synchronizing the step of disabling with the second warning signal.

5. The method of claim 1 further including, prior to the step of disabling, delaying the warning signal by an amount of time based on the first clock pulse.

6. The method of claim 1 further including de-asserting the warning signal, and resuming switching of the digital logic subsequent to the step of de-asserting the warning signal.

7. The method of claim 1 wherein the digital circuitry is a bus interface circuitry.

8. The method of claim 7 wherein the bus interface circuitry is a PCI bus interface.

9. In a mixed-signal integrated circuit having digital circuitry and analog-digital conversion circuitry, a method of operating the integrated circuit to convert between analog and digital signals comprising the steps of:

providing first and second clock signals;

timing the digital circuitry based on the first clock signal;

producing a conversion enable signal based on the second clock signal;

prior to producing the conversion enable signal, asserting a disable signal;

in response to asserting the disable signal, disabling operation of the digital circuitry; and in response to producing the conversion enable signal, performing a conversion between an analog and a digital signal.

10. The method of claim 9 wherein the first and second clock signals are asynchronous and wherein the step of asserting the disable signal includes synchronizing the disable signal with respect to the first clock.

11. The method of claim 9 wherein producing the conversion enable signal includes dividing down the second clock signal to produce a third clock signal.

12. The method of claim 11 wherein asserting the disable signal includes producing an intermediate signal based on the third clock signal.

13. The method of claim 12 wherein asserting the disable signal further includes delaying the intermediate signal based on the first clock signal.

14. The method of claim 9 wherein the digital circuitry is a bus interface circuitry.

15. The method of claim 14 wherein the bus interface circuitry is a PCI bus interface.

16. An integrated circuit comprising:

a substrate;

analog circuitry disposed in a first region of the substrate, the analog circuitry having a first control terminal, the analog circuitry effective for converting between analog and digital signals in response to the first control terminal receiving a first control signal;

digital circuitry disposed in a second region of the substrate, the digital circuitry having a second control terminal, the digital circuitry being disabled in response to the second control terminal receiving a second control signal;

a first clock terminal outputting a first clock signal; and means coupled to the first clock terminal for generating a plurality of the first control signals and a plurality of the second control signals, the control signals generated based on the first clock signal, the first and second control inputs coupled to the means for generating to receive respectively the first and second control signals.

17. The integrated circuit of claim 16 wherein the first control signal is a transition between a first logic level and a second logic level and the second control signal is a signal that is asserted at either the first logic level or the second logic level.

18. The integrated circuit of claim 16 wherein the means for generating includes a clock divider having an input coupled to the clock terminal and an output to provide the first control signals, the clock divider further having an output indicative of a current value thereof; the means for generating further including a decoder having a selector input coupled to receive the current value of the clock divider, the decoder having an output coupled to provide the second control signals.

19. The integrated circuit of claim 16 further including a second clock terminal outputting a second clock signal, the second clock signal coupled to the digital circuitry thereby providing a clock signal to drive the digital circuitry, the first and second clock signals being asynchronous; the means for generating including:

a clock divider having an input to receive the first clock signal and an output for producing a third clock signal, the third clock signal coupled to the first control input, the clock divider further having an output indicative of a current value thereof;

a decoder having a selector input coupled to receive the current value of the clock divider and having a decoder output; and a delay circuit having an input coupled to receive the decoder output, the delay circuit being clocked by the second clock signal, the delay circuit having an output coupled to the second control input.

20. The integrated circuit of claim 19 further including a clock circuit disposed on the substrate, the clock circuit having an output coupled to the second clock terminal.

21. The integrated circuit of claim 19 further including first and second clock pads disposed on the substrate for receiving an externally generated clock signals, the first and second clock pads respectively coupled to the first and second clock terminals.

22. The method of claim 16 wherein the digital circuitry is a bus interface circuitry.

23. The method of claim 22 wherein the bus interface circuitry is a PCI bus interface.

\* \* \* \* \*